United States Patent
Barriau et al.

(10) Patent No.: US 9,428,679 B2
(45) Date of Patent: Aug. 30, 2016

(54) FLAME-RETARDANT BENZOXAZINE-CONTAINING COMPOSITION

(71) Applicant: Henkel AG & Co. KGAA, Duesseldorf (DE)

(72) Inventors: Emilie Barriau, Duesseldorf (DE); Stefan Kreiling, Duesseldorf (DE); Rainer Schoenfeld, Duesseldorf (DE); Manfred Doering, Worth (DE)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 14/623,721

(22) Filed: Feb. 17, 2015

(65) Prior Publication Data

US 2015/0159065 A1 Jun. 11, 2015

Related U.S. Application Data

(63) Continuation of application No. PCT/EP2013/066882, filed on Aug. 13, 2013.

(30) Foreign Application Priority Data

Aug. 31, 2012 (DE) .................. 10 2012 215 510

(51) Int. Cl.
| | | |
|---|---|---|
| *C09J 179/04* | (2006.01) | |
| *C09J 179/02* | (2006.01) | |
| *C08L 79/02* | (2006.01) | |
| *H05K 3/28* | (2006.01) | |
| *C09D 179/04* | (2006.01) | |

(52) U.S. Cl.
CPC .............. *C09J 179/04* (2013.01); *C08L 79/02* (2013.01); *C09D 179/04* (2013.01); *C09J 179/02* (2013.01); *H05K 3/28* (2013.01); *H05K 2201/012* (2013.01)

(58) Field of Classification Search
CPC ... C09J 179/04; C09J 179/02; C09D 179/04; C08L 79/02; H05K 3/28
See application file for complete search history.

(56) References Cited

U.S. PATENT DOCUMENTS

| | | |
|---|---|---|
| 4,607,091 A | 8/1986 | Schreiber |
| 5,021,484 A | 6/1991 | Schreiber et al. |
| 5,200,452 A | 4/1993 | Schreiber |
| 5,543,516 A | 8/1996 | Ishida |
| 8,470,916 B2 | 6/2013 | Glauner et al. |
| 8,703,882 B2 | 4/2014 | Lin et al. |
| 2010/0181696 A1 | 7/2010 | Glauner et al. |
| 2011/0257347 A1 | 10/2011 | Lin et al. |
| 2012/0097437 A1 | 4/2012 | Liao et al. |
| 2012/0322923 A1 | 12/2012 | Wermter et al. |

FOREIGN PATENT DOCUMENTS

| | | |
|---|---|---|
| WO | 2006035021 | 4/2006 |
| WO | 2011047939 A1 | 4/2011 |
| WO | 2011080306 A2 | 7/2011 |

OTHER PUBLICATIONS

Hwang et al.; Journal of Applied Polymer Science, vol. 110, 2413-2423 (2008).
Development of Novel Flame Retardent Thermosets Based on Benzoxazine-Phenolic Resins and a Glycidyl Phosphinate, 2011.
Handbook of Benzoxazine Resins, 2011, Part IX, Chapter 32: Polybenzoxazines with Enhanced Flame Retardancy.

*Primary Examiner* — John Uselding
(74) *Attorney, Agent, or Firm* — Steven C. Bauman

(57) ABSTRACT

The present invention relates to flame-retardant polymerizable compositions comprising at least one benzoxazine compound and particular phosphorus-containing polymers. The present invention further provides adhesives, sealants or coating materials comprising the polymerizable composition according to the invention, and polymerization products of said composition.

15 Claims, No Drawings

FLAME-RETARDANT BENZOXAZINE-CONTAINING COMPOSITION

The present invention relates to a flame-retardant polymerizable composition which contains at least one benzoxazine compound and certain phosphorus-containing polymers. The subject matter of the present invention further relates to adhesives, sealants, or coating agents which include the polymerizable composition according to the invention, and polymerization products of the mentioned composition.

To be able to ensure sufficient fire protection, in many fields of application it is of vital importance that the plastic materials used have flame-retardant properties.

Due to their good inherent fire protection properties, in particular plastic materials based on benzoxazine compounds are suitable for use in sensitive fields of application. However, it may be necessary to improve the flame-retardant properties of the particular benzoxazine-based materials by adding further flame retardants in order to obtain an optimal property profile.

In this regard, US Patent Application US 2011/0257347 A1 and the publication by Hwang et al. in the Journal of Applied Polymer Science, Vol. 110, 2413-2423 (2008), describe the use of 9,10-dihydro-9-oxa-10-phosphaphenanthrene-10-oxide (DOPO) or derivatives thereof for improving the flame retardant properties of benzoxazine-based resin systems.

However, in addition to improving the fire protection properties, it is of crucial importance that other properties of the benzoxazine-based resin systems are not adversely affected by the particular flame retardant. It is known that bisphenols, for example, may lower the polymerization temperature of benzoxazine resins and undesirably influence or accelerate their polymerization reaction.

In contrast, many polymeric flame retardants result in significant worsening of other physical properties of the cured benzoxazine resins, such as their heat resistance and/or mechanical fracture properties.

The object of the present invention, therefore, is to provide a flame-retardant, polymerizable composition based on benzoxazine, whose polymerization behavior is not significantly influenced by the flame retardant used. A further aim is that the flame retardant ensures effective flame protection, even at low concentrations, and does not impair the heat resistance and/or the mechanical fracture properties of the cured composition.

It has now been found that certain phosphorus-containing polymers based on polycarboxylic (thio)esters and/or polycarboxylic acid amides are able to impart effective flame retardance to a benzoxazine resin matrix, with good fire protection properties being achieved even at low additive contents. The phosphorus-containing polymers do not significantly influence the polymerization behavior of the particular compositions. In addition, the mechanical fracture properties and/or the heat resistance of the cured composition are/is maintained to the greatest extent possible, or even improved.

A first subject matter of the present invention therefore relates to a polymerizable composition containing
 a) at least one benzoxazine compound and
 b) at least one phosphorus-containing polymer selected from polycarboxylic (thio)esters or polycarboxylic acid amides, the phosphorus-containing polymer including at least one structural element of general formula (I),

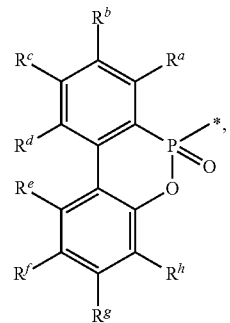

Formula (I)

where $R^a$, $R^b$, $R^c$, $R^d$, $R^e$, $R^f$, $R^g$, and $R^h$ are independently selected from hydrogen, alkyl, aryl, alkoxy, aryloxy, aralkyl, halogen, cyanide, thiol, amine, carboxyl, or acyl.

The polymerizable compositions of the present invention are particularly suited for producing adhesives, sealants, or coating agents, and for producing composite materials which include a layer or a bundle of fibers such as carbon fibers.

Therefore, the subject matter of the present invention also relates to adhesives, sealants, or coating agents which include the polymerizable composition according to the invention, and to the polymerization product of the particular composition according to the invention, whereby the mentioned polymerization product may include a layer or a bundle of fibers such as carbon fibers.

A further subject matter of the present invention relates to an electronic component which includes the polymerizable composition according to the invention or the polymerization product thereof.

The subject matter of the present invention relates also to the use of one or more of the above-mentioned phosphorus-containing polymers as flame retardant for benzoxazine compounds or as flame retardant for the polymerization products thereof.

The benzoxazine compound of the present invention is a monomer, oligomer, or polymer which includes at least one benzoxazine group. Preferred monomers may have up to four benzoxazine groups. Single monomers as well as mixtures of two or more monomers may be used.

Several benzoxazine compounds which include up to four benzoxazine groups are discussed below.

Suitable benzoxazine compounds are preferably described by formula (B-I),

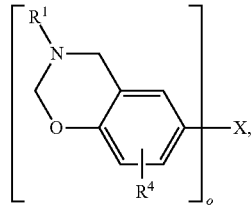

Formula (B-I)

where o is an integer between 1 and 4, X is selected from the group comprising alkyl (for o=1), alkylene (for o=2 to 4), oxygen (for o=2), thiol (for o=1), sulfur (for o=2), sulfoxide (for o=2), sulfone (for o=2), and a direct covalent bond (for o=2), $R^1$ is selected from the group comprising hydrogen, alkyl, alkenyl, and aryl, and $R^4$ is selected from the group comprising hydrogen, halogen, alkyl, and alkenyl, or $R^4$ is a divalent radical which forms a corresponding naphthoxazine structure from the benzoxazine structure.

Particularly preferred structures according to formula (B-I) are represented by formula (B-II), Formula (B-II)

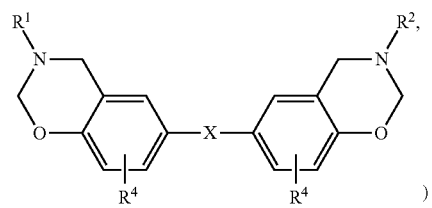

where X is selected from the group comprising $CH_2$, $C(CH_3)_2$, C=O, O, S, S=O, O=S=O, and a direct covalent bond, $R^1$ and $R^2$ are the same or different and are each selected from the group comprising hydrogen, alkyl, in particular methyl, ethyl, n-propyl, isopropyl, n-butyl, or isobutyl, alkenyl, in particular allyl, and aryl, and the substituents $R^4$ are the same or different and are each selected from the group comprising hydrogen, halogen, alkyl, and alkenyl, or $R^4$ in each case is a divalent radical which forms a corresponding naphthoxazine structure from the benzoxazine structure.

Preferred benzoxazine compounds according to formula (B-II) are, for example, benzoxazine compounds according to formulas (B-III) to (B-VI), Formula (B-III)

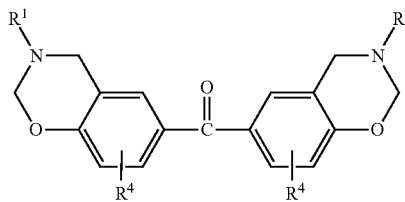

Formula (B-IV)

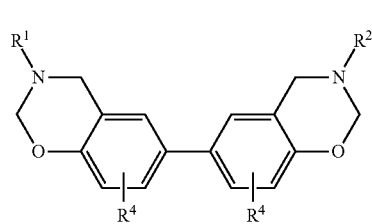

Formula (B-V)

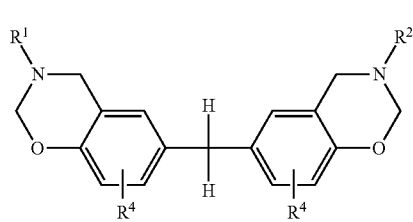

Formula (B-VI)

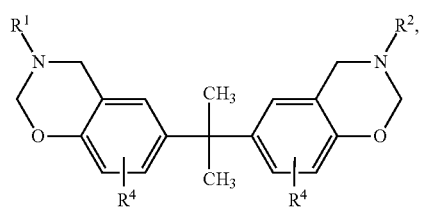

where $R^1$, $R^2$, and $R^4$ are defined as above.

Further preferred benzoxazine compounds are compounds of general formula (B-VII), Formula (B-VII)

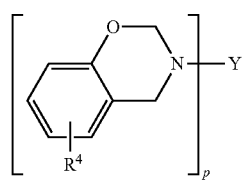

where p=2 and Y is selected from the group comprising biphenyl, diphenylmethane, diphenylisopropane, diphenylsulfide, diphenylsulfoxide, diphenylsulfone, diphenylketone, and $R^4$ as defined above.

Preferred benzoxazine compounds are also compounds of general formulas (B-VIII) to (B-X), Formula (B-VIII)

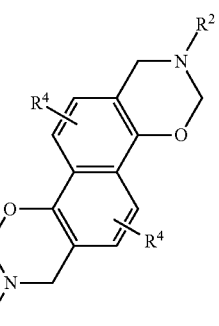

Formula (B-IX)

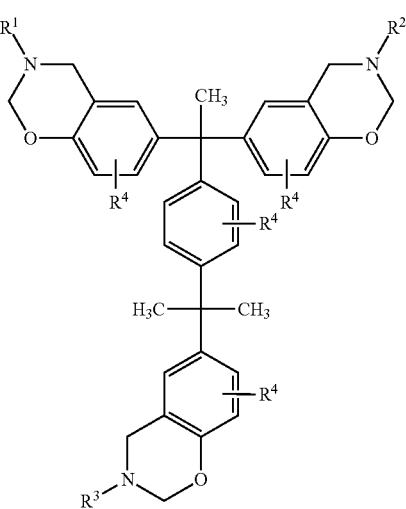

Formula (B-X)

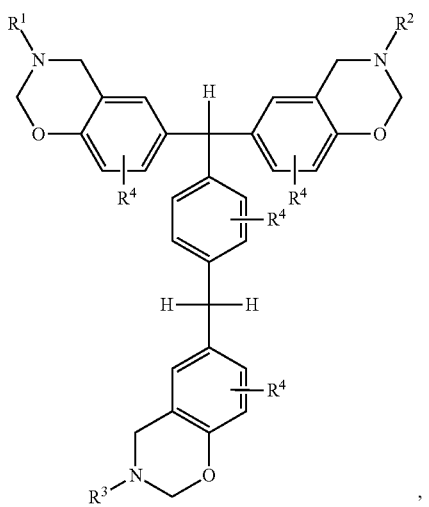

where R¹, R², and R⁴ are defined as above and R³ is defined in the same way as R¹ or R².

Examples of suitable benzoxazine compounds within the meaning of the present invention are the following compounds:

Formula (B-XI)

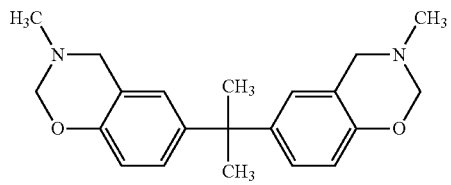

Formula (B-XII)

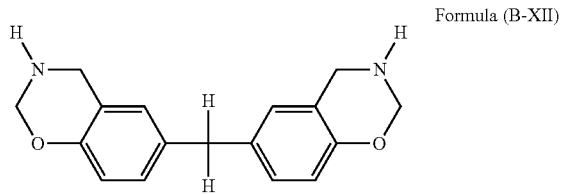

Formula (B-XIII)

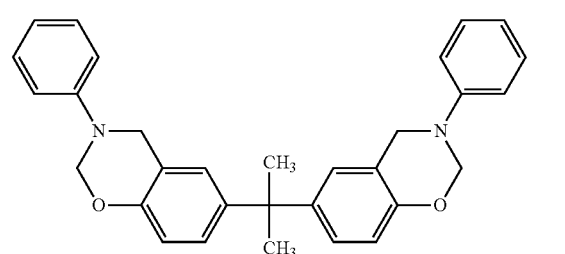

Formula (B-XIV)

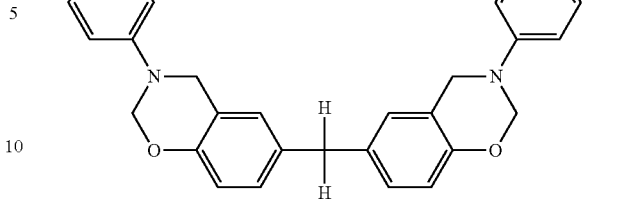

Formula (B-XV)

Formula (B-XVI)

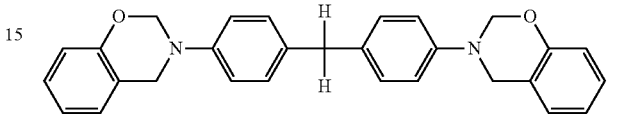

Formula (B-XVII)

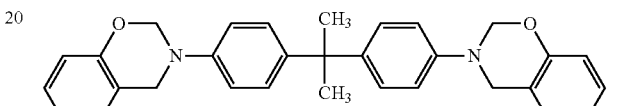

Formula (B-XVIII)

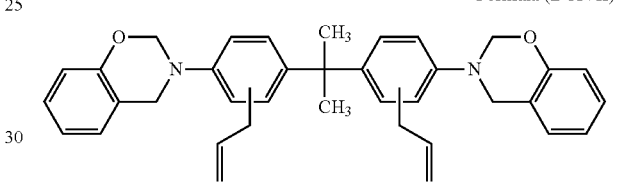

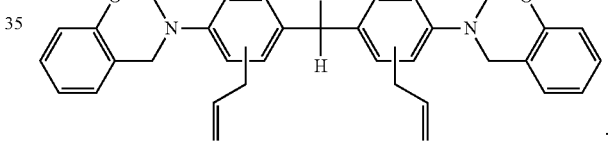

A further benzoxazine compound which may be used within the scope of the present invention is selected from compounds of formula (B-XIX), Formula (B-XIX)

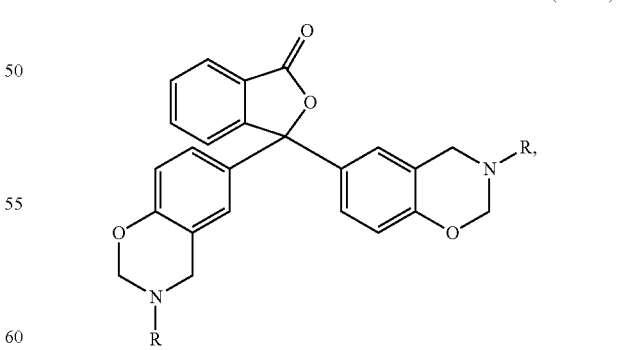

where each R in formula (B-XIX) is independently selected from allyl, aryl, $C_1$-$C_8$ alkyl, and $C_3$-$C_8$ cycloalkyl. The above-mentioned groups may be present substituted or unsubstituted, wherein suitable substituents are selected, for example, from amino, allyl, and $C_1$-$C_8$ alkyl. All radicals R in formula (B-XIX) are preferably identical, whereby R in particular stands for a phenyl group.

Benzoxazine compounds within the meaning of the present invention are commercially available, and marketed by Huntsman Advanced Materials, Georgia-Pacific Resins, Inc., and Shikoku Chemicals Corporation, Chiba, Japan, among others.

Notwithstanding, the benzoxazine compounds of the present invention may also be obtained by reacting a phenolic compound, such as bisphenol A, bisphenol F, bisphenol S, or thiophenol, with an aldehyde, for example formaldehyde, in the presence of a primary alkylamine or arylamine. Suitable production methods are disclosed, for example, in U.S. Pat. No. 5,543,516, in particular in Examples 1 to 19 in columns 10 to 14, whereby the reaction time of the reaction in question may be from several minutes to several hours, depending on the concentration, reactivity, and reaction temperature. Further production options for the benzoxazine compounds of the present invention may be found in U.S. Pat. Nos. 4,607,091, 5,021,484, and 5,200,452, and International Patent Application WO 2006/035021 A1.

The polymerizable composition according to the invention may contain only one benzoxazine compound, or may contain a mixture of various benzoxazine compounds. The proportion of the benzoxazine compound in the total quantity of the polymerizable composition according to the invention is preferably 20 to 99.5% by weight, particularly preferably 30 to 90% by weight, and very particularly preferably 60 to 80% by weight. The above-mentioned proportion of the benzoxazine compound is understood to mean the total content of all benzoxazine compounds contained in the polymerizable composition according to the invention.

The polymerizable composition according to the invention further contains at least one phosphorus-containing polymer as flame retardant, which is selected from polycarboxylic acid (thio) esters or polycarboxylic acid amides, wherein the phosphorus-containing polymer includes at least one structural element of general formula (I),

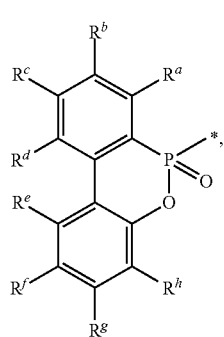

Formula (I)

where $R^a$, $R^b$, $R^c$, $R^d$, $R^e$, $R^f$, $R^g$, and $R^h$ are independently selected from hydrogen, alkyl, aryl, alkoxy, aryloxy, aralkyl, halogen, cyanide, thiol, amine, carboxyl, or acyl. It is particularly preferred that at least six of the radicals $R^a$ to $R^h$ stand for hydrogen, wherein each of the radicals $R^a$, $R^b$, $R^c$, $R^d$, $R^e$, $R^f$, $R^g$, and $R^h$ particularly preferably stands for hydrogen.

Within the meaning of the present invention, a "phosphorus-containing polymer" is understood to mean a compound which contains at least one phosphorus atom and which is made up of at least two monomer units, preferably at least 10 monomer units, and very particularly preferably at least 20 monomer units.

Within the meaning of the present invention, the term "polycarboxylic acid(thio)ester" is understood to mean a polycarboxylic acid ester as well as a polycarboxylic acid thioester.

Within the meaning of the present invention, the term "polycarboxylic acid ester" is understood to mean a polymer which has ester functions in the main chain, and which may be obtained, for example, in a polycondensation reaction by reacting a polycarboxylic acid with a polyol.

Within the meaning of the present invention, the term "polycarboxylic acid thioester" is understood to mean a polymer which has thioester functions in the main chain, and which may be obtained, for example, in a polycondensation reaction by reacting a polycarboxylic acid with a polythiol.

Within the meaning of the present invention, the term "polycarboxylic acid amide" is understood to mean a polymer which has amide functions in the main chain, and which may be obtained, for example, in a polycondensation reaction by reacting a polycarboxylic acid with a polyamine.

For optimizing the polymerization behavior of the polymerizable composition according to the invention and/or for improving the mechanical fracture properties of the polymerization product according to the invention, it may be advantageous to use phosphorus-containing polymers which have one or more terminal functional groups that are independently selected from carboxyl groups, hydroxyl groups, amine groups, thiol groups, phosphinic acid groups, or phosphonic acid groups. Phosphorus-containing polymers which bear one or more terminal hydroxyl groups are particularly preferred within the meaning of the present invention. Phosphorus-containing polymers which have solely hydroxyl groups as terminal functional groups are very particularly preferred.

In one embodiment of the present invention, the phosphorus-containing polymer includes one or more structural units of general formula (II),

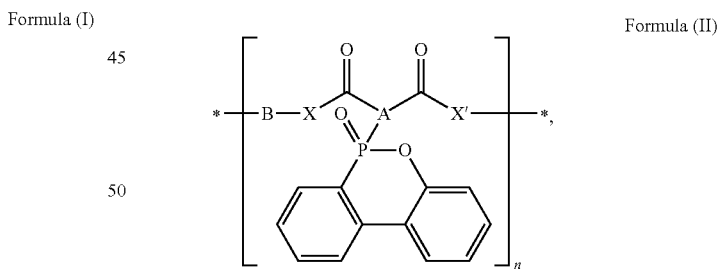

Formula (II)

where n is an integer from 2 to 10,000, X and X' are independently selected from —O—, —S—, or —NH—, A is a trivalent compound group containing 1 to 100 C atoms, and B is a divalent compound group containing 2 to 100 C atoms.

The divalent compound group B is preferably a linear or branched group that is selected from alkylene groups, polyoxyalkylene groups, arylene groups, or from any combinations thereof.

Particularly preferred phosphorus-containing polymers of the present invention are compounds of general formula (III),

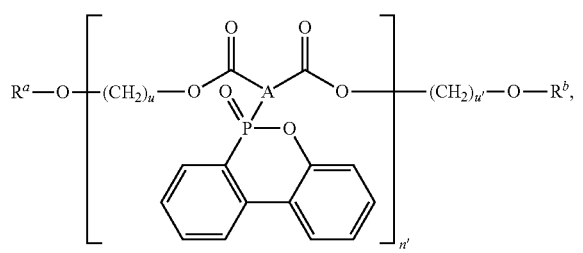

Formula (III)

where n' is an integer from 2 to 1000, u and u' independently stand for an integer from 1 to 10, preferably from 2 to 4, A is a trivalent compound group containing 1 to 100 C atoms, and $R^a$ and $R^b$ are independently selected from hydrogen, alkyl, or acyl. $R^a$ and $R^b$ particularly preferably stand for hydrogen.

The trivalent compound group A of formulas (II) and (III) is preferably a branched aliphatic group which preferably contains 2 to 5 C atoms, in particular 3 C atoms.

The number average molecular weight (Mn) of the phosphorus-containing polymer is preferably greater than approximately 20,000 g/mol, whereby phosphorus-containing polymers having a number average molecular weight (Mn) of 25,000 g/mol to 100,000 g/mol are particularly preferred due to their good compatibility and efficient flame retardant properties. Unless otherwise noted, within the scope of the present invention the number average molecular weight is determined by gel permeation chromatography (GPC), using a polystyrene standard.

The phosphorus content of the phosphorus-containing polymer used according to the invention may be varied over a wide range. For achieving optimal flame retardant properties, the phosphorus content is preferably 5 to 12% by weight, based on the total quantity of the phosphorus-containing polymer.

Due to the high effectiveness of the phosphorus-containing polymer used according to the invention, very good flame retardant properties are achievable, even at low phosphorus contents, so that the total phosphorus content of the polymerizable composition according to the invention is preferably between 0.01 and 1.5% by weight.

In order to achieve good mechanical fracture properties and/or good heat resistance in addition to good compatibility with the benzoxazine resin matrix, it is of great importance for the present invention that the phosphorus-containing polymer is selected from polycarboxylic (thio)esters or polycarboxylic acid amides. In particular, it is advantageous that the phosphorus-containing polymer used according to the invention is a polycarboxylic acid ester, since particularly good heat resistance and/or good mechanical fracture properties may be achieved by using these polymers.

Within the meaning of the present invention, the mechanical fracture properties may be determined by ascertaining the critical stress intensity factor K1c and the critical energy release rate G1c. The critical stress intensity factor K1c and the critical energy release rate G1c may be determined in accordance with ASTM D5045-96, using so-called "single etch notch bending (SENB), in each case using a test specimen having dimensions of 56 mm×12.7 mm×3.2 mm.

Suitable phosphorus-containing polymers are commercially available, and are marketed, for example, by Schill+ Seilacher AG under the trade name Ukanol FR 80.

The phosphorus-containing polymers may also be produced according to any suitable method. One possible production method is based on the reaction of 9,10-dihydro-9-oxa-10-phosphaphenanthrene-10-oxide or derivatives thereof with unsaturated compounds from the group of polyvalent carboxylic acids or their anhydrides. The addition product thus formed may be reacted with corresponding polyols, polyamines, and/or polythiols in a polycondensation reaction to yield the corresponding phosphorus-containing polycarboxylic (thio)esters and/or polycarboxylic acid amides of the present invention. Examples of suitable polyols are aliphatic diols, which are preferably selected from monoethylene glycol, diethylene glycol, propylene glycol, 1,3-propanediol 1,3-butanediol, 1,4-butanediol, hexanediol, 1,10-decanediol, or from mixtures thereof. Examples of suitable production methods may be found in European Patent Application EP 2 090 618 A2 in paragraphs [0015] to [0020], and International Patent Application WO 2009/109347 A1.

The polymerizable composition according to the invention may contain a phosphorus-containing polymer or a mixture of a plurality of the above-mentioned phosphorus-containing polymers.

The proportion of the phosphorus-containing polymer in the total quantity of the polymerizable composition according to the invention is preferably 0.01 to 20% by weight, particularly preferably 0.1 to 10% by weight, and very particularly preferably 1 to 7.5% by weight. Within the meaning of the above statement, the above-mentioned proportion of the phosphorus-containing polymer is understood to mean all phosphorus-containing polymers contained in the polymerizable composition according to the invention.

In one embodiment, the polymerizable composition includes solely one or more benzoxazine compounds as the polymerizable resin component. For certain applications, however, it may be advantageous for the polymerizable composition to additionally include further polymerizable resin components. Suitable compounds may be selected, for example, from the group of epoxy resins, polyurethane resins, polyester resins, polyamide resins, or phenolic resins, or from any mixtures thereof.

Within the scope of the present invention, "epoxy resin" is understood to mean a resin composition which is formed on the basis of epoxy compounds or epoxy-containing compounds.

In one preferred embodiment of the invention, the epoxy compounds or epoxy-containing compounds of the epoxy resin system of the polymerizable preparation may include oligomeric as well as monomeric epoxy compounds, in addition to epoxides of the polymeric type, and may represent aliphatic, cycloaliphatic, aromatic, or heterocyclic compounds.

Suitable epoxy resins within the scope of the present invention are preferably selected, for example, from epoxy resins of the bisphenol-A type, epoxy resins of the bisphenol-S type, epoxy resins of the bisphenol-F type, epoxy resins of the phenol novolak type, epoxy resins of the cresol novolak type, epoxidized products of numerous dicyclopentadiene-modified phenolic resins, obtainable by reacting dicyclopentadiene with numerous phenols, epoxidized products of 2,2',6,6'-tetramethylbiphenol, aromatic epoxy resins such as epoxy resins having a naphthalene base structure and epoxy resins having a fluorene base structure, aliphatic epoxy resins, alicyclic epoxy resins such as 3,4-epoxycyclohexylmethyl-3,4-epoxycyclohexane carboxylate, and bis (3,4-epoxycyclohexyl) adipate and epoxy resins having at least one hetero ring.

The epoxy resins include in particular octadecylene oxide, styrene oxide, vinylcyclohexene oxide, glycidol, vinylcyclohexene dioxide, 3,4-epoxycyclohexylmethyl-3,4-epoxycyclohexene carboxylate, 3,4-epoxy-6-methylcyclohexylmethyl-3,4-epoxy-6-methylcyclohexene carboxylate, bis(3,4-epoxy-6-methylcyclohexylmethyl) adipate, bis(2,3-epoxycyclopentyl) ether, aliphatic dipentene dioxide, epoxidized polybutadiene (for example, Krasol products from Sartomer), epoxy functionality-containing silicone resin, flame-retardant epoxy resins (DER-580, for example), bis(3,4-epoxycyclohexyl) adipate, 2-(3,4-epoxycyclohexyl-5,5-spiro-3,4-epoxy)cyclohexane-meta-dioxane, vinylcyclohexene monoxide, and 2-epoxyhexadecane.

Particularly preferred epoxy resins within the meaning of the present invention are cycloaliphatic epoxy resins, which are commercially available, for example, under the trade names CY179 (Huntsman), ACHWL CER 4221 (Achiewell, LLC), or Cyracure 6105/6110 (DOW Chemical).

The polymerizable composition according to the invention may contain only one epoxy resin, or may contain a mixture of a plurality of the above-mentioned epoxy resins.

The proportion of the epoxy resin, if present, in the total quantity of the polymerizable composition is preferably 5 to 50% by weight, particularly preferably 10 to 30% by weight, and very particularly preferably 15 to 25% by weight. Within the meaning of the present invention, the above-mentioned proportion of the epoxy resin is understood to mean the total content of all epoxy resins contained in the polymerizable composition according to the invention.

The polymerizable composition according to the invention may also contain, in addition to the components described above, one or more additives which are preferably selected from fillers, softeners, reactive diluents, impact resistance modifying agents, rheological aids, wetting agents, aging protection agents, stabilizers, color pigments, or mixtures thereof.

Preferred compositions according to the inventions include or consist of:
a) 50 to 99.5% by weight of at least one benzoxazine compound,
b) 0.01 to 20% by weight of at least one phosphorus-containing polymer of the present invention,
c) 0 to 20% by weight of at least one epoxy resin, in particular at least one cycloaliphatic epoxy resin, and
d) 0 to 20% by weight of at least one additive, based on the total quantity of the polymerizable composition.

In particular, it is advantageous for the polymerizable composition according to the invention to be substantially free of halogen. Within the meaning of the present invention, the term "substantially free of halogen" means that the proportion of halogen atoms in the total quantity of the polymerizable composition according to the invention is less than approximately 0.1% by weight, preferably less than approximately 0.01% by weight, and in particular less than approximately 0.001% by weight. Small residual quantities of halogen-containing compounds may be introduced into the polymerizable composition, for example, by the solvent used, or by the initiator used. Although residual quantities of halogen are present in these compositions, they do not affect the physical properties of the finished compositions, for example with regard to their flame-retardant properties, resistance to peeling, and dielectric properties.

In particular, it is advantageous when the polymerizable composition of the present invention is completely free of halogen-containing flame retardants.

A further subject matter of the present invention relates to the polymerization product of the polymerizable composition according to the invention.

Within the scope of the polymerization of the polymerizable composition according to the invention, polymerization of the contained benzoxazine compounds takes place. This polymerization may take place at elevated temperatures according to a self-initiating mechanism (thermal polymerization) or by the addition of cationic initiators.

Examples of suitable cationic initiators are Lewis acids or other cationic initiators, such as metal halides, organometallic reagents such as metalloporphyrins, and methyl tosylates, methyl triflates, or trifluorosulfonic acids. Likewise, basic reagents may be used to initiate the polymerization of the contained benzoxazine compound(s). Suitable basic reagents may be selected from imidazole or imidazole derivatives, for example.

The thermal polymerization of the polymerizable composition according to the invention preferably takes place at temperatures of 150 to 300° C., in particular at temperatures of 160 to 220° C. As a result of using the above-mentioned initiators and/or other reagents, the polymerization temperature may be even lower.

In one preferred embodiment of the invention, the polymerization product according to the invention encloses a layer or a bundle of fibers, the fibers being treated with the polymerizable composition according to the invention prior to the curing (polymerization). A fiber-reinforced composite material is obtained due to the subsequent curing.

A further subject matter of the present invention, therefore, relates to a method for producing a polymerization product of the polymerizable composition according to the invention, wherein the mentioned composition encloses a layer or a bundle of fibers, and the fibers are treated with the polymerizable composition according to the invention prior to the curing.

The method according to the invention comprises the following steps:
a) providing a layer or a bundle of fibers;
b) providing the polymerizable composition according to the invention;
c) producing a composite system by treating a layer or a bundle of fibers with the polymerizable composition according to the invention;
d) optionally removing an excess quantity of the polymerizable composition from the composite system; and
e) carrying out a polymerization reaction by subjecting the composite system to elevated temperature and preferably increased pressure.

Within the meaning of the present invention, the term "elevated temperature" is understood to mean temperatures of preferably 40° C. to 300° C., particularly preferably 50° C. to 280° C., and very particularly preferably 80° C. to 250° C.

The mentioned fibers are preferably selected from glass fibers, carbon fibers, aramid fibers, boron fibers, aluminum oxide fibers, or silicon carbide fibers. Two or more of these types of fibers may be used as a mixture. The use of carbon fibers is particularly preferred in order to produce a product having a lower weight and higher durability.

Within the meaning of the present invention, the layer or the bundle of fibers is not restricted to a certain form or configuration; thus, for example, long fibers laid in parallel in one direction, tow yarns, fabric (material), mats, knitted fabric, or braids may be used.

The fiber-reinforced composite materials produced according to the mentioned method may be used, for example, in aircraft manufacturing or in the automotive industry due to their low weight and high structural strength.

In general, any known production method from the prior art may be used in the production of the fiber-reinforced composite materials of the present invention.

In one widely used method for producing fiber-reinforced composite materials, prepregs or towpregs made of fibers (reinforcement fibers) and uncured polymerizable compositions are produced as intermediate product, and are then laminated by hand and heat-cured.

In the resin injection process (resin transfer molding (RTM)), a liquid, heat-curable polymerizable composition is injected, optionally under pressure, into a reinforcement fiber substrate which is present in a mold, and the reinforcement fiber substrate is then heat-cured to obtain a fiber-reinforced composite material. Alternatively, a reinforcement fiber substrate that is present in an open mold may be covered by a vacuum bag, so that aspiration can be performed during injection of the polymerizable composition. The latter process is also referred to as vacuum-assisted resin transfer molding (VARTM).

A further subject matter of the present invention relates to an adhesive, sealant, or coating agent which includes the polymerizable composition according to the invention.

Due to the advantageous combination of good fire protection properties with a low shrinkage tendency, and high thermal load capacity, the composition according to the invention and its polymerization products may be used in a particularly advantageous manner for producing electronic components. A further subject matter of the present invention therefore relates to an electronic component which includes the polymerizable composition according to the invention or the polymerization product thereof. Suitable electronic components may be selected, for example, from integrated circuits, semiconductor units, solar cells, solar modules, or light-emitting diodes.

EXAMPLES

As benzoxazine compound (Box), a mixture of two benzoxazine compounds was used that was composed of:

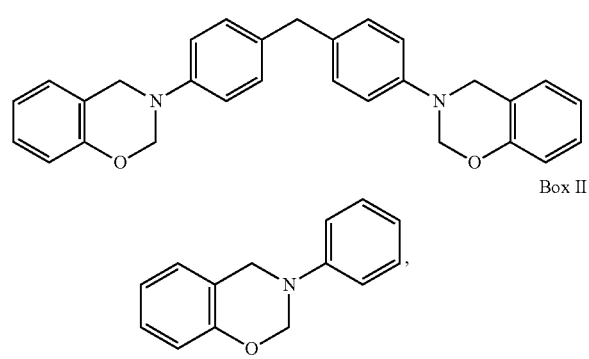

Box I

Box II containing 60% by weight of Box I and 40% by weight of Box II, based on the total quantity of the mixture.

The polymerizable composition was produced by providing the benzoxazine compounds Box I and Box II shown above, and cycloaliphatic epoxy resin CER 4221 from Achiewell Inc., in a suitable apparatus. The appropriate quantity of phosphorus-containing polyester Ukanol FR80 from Schill+Seilacher AG, and optionally further additives and initiators, were added, with stirring. The mixture was homogenized under vacuum (<10 mbar) at 80° C. for 15 to 30 minutes, with stirring, and subsequently stored in closed containers.

Table 1 shows the contents of the individual components of the polymerizable compositions, in each case based on the total quantity of the polymerizable composition.

TABLE 1

| Polymerizable compositions | | | |
|---|---|---|---|
| Polymerizable composition | Box I + Box II [% by weight] | CER 4221 [% by weight] | Ukanol FR80 [% by weight] |
| 1 (Reference) | 75 | 25 | — |
| 2 | 73.12 | 24.38 | 2.50 |
| 3 | 71.25 | 23.75 | 5.00 |

The polymerizable compositions were thermally cured in an autoclave at 180° C. for 90 min. The cured samples (polymerization products) were subsequently cooled to 22° and characterized, using the following methods.

The glass transition temperature ($T_g$) was determined by dynamic mechanical thermal analysis (DMTA), the particular glass transition temperature being obtained from the maximum value of the loss modulus versus temperature diagram.

The fire protection class was determined in accordance with the UL-94 Vertical Burning Test, using cured samples (polymerization products) having a thickness of 4 mm. In the UL-94 Vertical Burning Test, materials having particularly good fire protection properties are assigned classification V0.

The glass transition temperatures ($T_g$) of the polymerization products of the polymerizable compositions and their fire protection properties are shown in Table 2.

TABLE 2

| Glass transition temperature and fire protection behavior | | |
|---|---|---|
| Composition | Tg [° C.] | UL-94 classification |
| 1 (Reference) | 202 | >V1 |
| 2 | 205 | V0-V1 |
| 3 | 204 | V0 |

Table 2 shows that a very good fire protection classification may be achieved even at extremely low contents (2.5% by weight) of phosphorus-containing polymers. In addition, the phosphorus-containing polymers used according to the invention do not cause undesirable lowering of the glass transition temperature ($T_g$) of the cured benzoxazine resin matrix. In summary, it may thus be concluded that the phosphorus-containing polymers of the present invention represent effective flame retardants for benzoxazine compounds, and do not adversely affect the physical properties of the cured polymerization products.

What is claimed is:

1. Polymerizable composition comprising
   a) at least one benzoxazine compound and
   b) at least one phosphorus-containing polymer selected from the group consisting of polycarboxylic (thio) esters and polycarboxylic acid amides, wherein the phosphorus-containing polymer includes as part of the polymer at least one structural element of general formula (I), Formula (I)

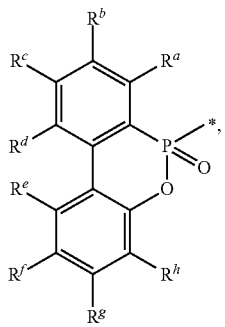

wherein $R^a$, $R^b$, $R^c$, $R^d$, $R^e$, $R^f$, $R^g$, and $R^h$ are independently members selected from the group consisting of hydrogen, alkyl, aryl, alkoxy, aryloxy, aralkyl, halogen, cyanide, thiol, amine, carboxyl, or acyl.

2. Polymerizable composition according to claim 1, characterized in that the phosphorus-containing polymer has one or more terminal functional groups that are independently selected from the group consisting of carboxyl groups, hydroxyl groups, amine groups, thiol groups, phosphinic acid groups, or phosphonic acid groups.

3. Polymerizable composition according to claim 1, characterized in that the phosphorus-containing polymer includes as part of the polymer one or more structural units of general formula (II), Formula (II)

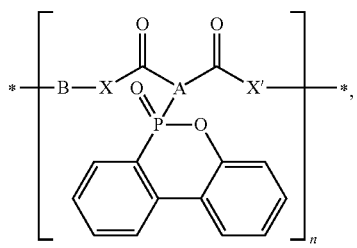

wherein n is an integer from 2 to 10,000, X and X' are independently selected from the group consisting of —O—, —S—, and —NH—, A is a trivalent compound group containing 1 to 100 C atoms, and B is a divalent compound group containing 2 to 100 C atoms.

4. Polymerizable composition according to claim 3, characterized in that B in formula (II) is a linear or branched compound group that is selected from the group consisting of alkylene groups, polyoxyalkylene groups, arylene groups, or from any combinations thereof.

5. Polymerizable composition according to claim 1, characterized in that the phosphorus-containing polymer is a compound of general formula (III), Formula (III)

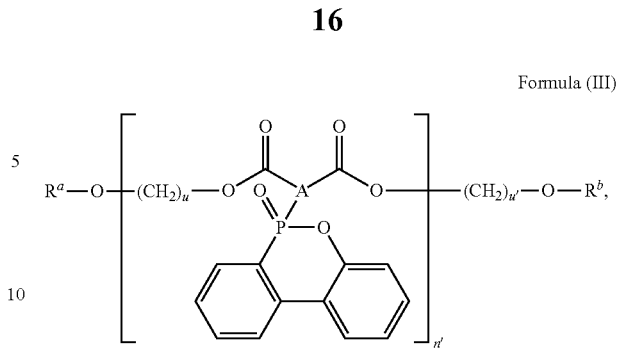

wherein n' is an integer from 2 to 1000, u and u' independently stand for an integer from 1 to 10, A is a trivalent compound group containing 1 to 100 C atoms, and $R^a$ and $R^b$ are independently selected from the group consisting of hydrogen, alkyl, or acyl.

6. Polymerizable composition according to claim 1, characterized in that the phosphorus-containing polymer has a number average molecular weight ($M_n$) of 25,000 g/mol to 100,000 g/mol.

7. Polymerizable composition according to claim 1, characterized in that the phosphorus content of the phosphorus-containing polymer is 5 to 12% by weight.

8. Polymerizable composition according to claim 1, characterized in that the total phosphorus content of the polymerizable composition is between 0.01 and 1.5% by weight.

9. Polymerizable composition according to claim 1, characterized in that the phosphorus-containing polymer is a polycarboxylic acid ester.

10. Polymerizable composition according to claim 1, characterized in that
    the content of the polymerizable benzoxazine compound is 20 to 99.5% by weight and/or
    the content of the phosphorus-containing polymer is 0.1 to 10% by weight,
in each case based on the total quantity of the polymerizable composition.

11. Polymerizable composition according to claim 1, characterized in that the polymerizable composition is substantially free of halogen.

12. Polymerization product of the polymerizable composition according to claim 1.

13. Adhesive, sealant, or coating agent comprising a polymerizable composition according to claim 1.

14. Polymerizable composition according to claim 1, wherein the at least one benzoxazine compound is represented by Formula (B-1)

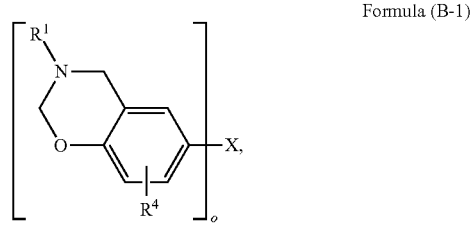

wherein $R^1$ is selected from the group consisting of hydrogen, alkyl, alkenyl, and aryl and $R^4$ is selected from the group consisting of hydrogen, halogen, alkyl, and alkenyl, or $R^4$ is a divalent radical which forms a corresponding naphthoxazine structure from the benzoxazine structure.

15. Polymerizable composition according to claim 1, wherein the at least one benzoxazine compound comprises the combination of

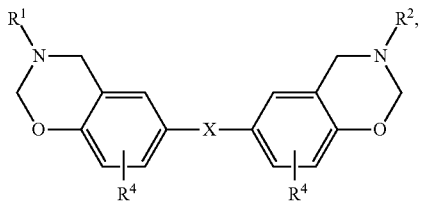

Formula (B-II)

wherein X is selected from the group consisting of CH$_2$, C(CH$_3$)$_2$, C=O, O, S, S=, O=S=O, and a direct covalent bond, R$^1$ and R$^2$ are the same or different and are each selected from the group consisting of hydrogen, alkyl, alkenyl and aryl, and the substituents R$^4$ are the same or different and are each selected from the group consisting of hydrogen, halogen, alkyl and alkenyl, or R$^4$ in each case is a divalent radical which forms a corresponding naphthoxazine structure, and

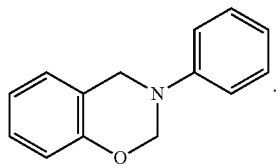

Box-II

\* \* \* \* \*